United States Patent
Bulovic et al.

(10) Patent No.: US 9,419,147 B2
(45) Date of Patent: *Aug. 16, 2016

(54) ELECTRONICALLY CONTROLLED SQUISHABLE COMPOSITE SWITCH

(71) Applicant: Massachusetts Institute of Technology, Cambridge, MA (US)

(72) Inventors: Vladimir Bulovic, Lexington, MA (US); Jeffrey H. Lang, Sudbury, MA (US); Sarah Paydavosi, Tehran (IR); Annie I-Jen Wang, Cambridge, MA (US); Trisha L. Andrew, Cambridge, MA (US); Apoorva Murarka, Jaipur (IN); Farnaz Niroui, Ontario (CA); Frank Yaul, Bellevue, WA (US); Jeffrey C. Grossman, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/593,066

(22) Filed: Jan. 9, 2015

(65) Prior Publication Data
US 2015/0228805 A1    Aug. 13, 2015

Related U.S. Application Data

(63) Continuation of application No. 13/291,016, filed on Nov. 7, 2011, now Pat. No. 8,933,496.

(60) Provisional application No. 61/410,611, filed on Nov. 5, 2010.

(51) Int. Cl.
*H01L 29/84*      (2006.01)
*H01L 29/417*     (2006.01)
(Continued)

(52) U.S. Cl.
CPC ............ *H01L 29/84* (2013.01); *H01L 27/0629* (2013.01); *H01L 29/41725* (2013.01); *H01L 45/00* (2013.01); *Y10S 977/742* (2013.01)

(58) Field of Classification Search
CPC ..... H01L 45/00; H01L 27/0629; H01L 29/84; H01L 29/41725; Y10S 977/742
See application file for complete search history.

(56) References Cited

U.S. PATENT DOCUMENTS

| 3,125,739 | A | 3/1964 | Deibel et al. |
| 6,121,870 | A | 9/2000 | Ariga et al. |

(Continued)

FOREIGN PATENT DOCUMENTS

WO    03107372 A1    12/2003

OTHER PUBLICATIONS

Karimov, KH.S., et al., "Pressure sensitive organic field effect transistor," Physica E—Low-Dimensional Systems and Nanostructures, Elsevier Science BV, NL, vol. 43, No. 1, pp. 547-551, Nov. 1, 2010.
(Continued)

*Primary Examiner* — Robert Carpenter
(74) *Attorney, Agent, or Firm* — Volpe and Koenig, P.C.

(57) ABSTRACT

A method and apparatus for making analog and digital electronics which includes a composite including a squishable material doped with conductive particles. A microelectromechanical systems (MEMS) device has a channel made from the composite, where the channel forms a primary conduction path for the device. Upon applied voltage, capacitive actuators squeeze the composite, causing it to become conductive. The squishable device includes a control electrode, and a composite electrically and mechanically connected to two terminal electrodes. By applying a voltage to the control electrode relative to a first terminal electrode, an electric field is developed between the control electrode and the first terminal electrode. This electric field results in an attractive force between the control electrode and the first terminal electrode, which compresses the composite and enables electric control of the electron conduction from the first terminal electrode through the channel to the second terminal electrode.

14 Claims, 10 Drawing Sheets

(51) Int. Cl.
*H01L 27/06* (2006.01)
*H01L 45/00* (2006.01)

(56) References Cited

U.S. PATENT DOCUMENTS

| | | |
|---|---|---|
| 6,291,568 B1 | 9/2001 | Lussey |
| 6,373,007 B1 | 4/2002 | Calcatera et al. |
| 8,933,496 B2 * | 1/2015 | Bulovic ............... H01L 45/00 257/2 |
| 2007/0236623 A1 | 10/2007 | Heo et al. |
| 2012/0112152 A1 | 5/2012 | Bulovic et al. |

OTHER PUBLICATIONS

Lacasse, M., et al., "Characterization of the Electrical Resistance of Carbon-Black-Filled Silicone: Application to a Flexible and Stretchable Robot Skin," 2010 IEEE International Conference on Robotics and Automation, ICRA 2010, Anchorage, Alaska, USA, pp. 4842-4848, May 3-8, 2010.

Someya, T., et al., "Printed organic transistors; Toward ambient electronics," Electron Devices Meeting (IEDM), 2009 IEEE International, IEEE, Pisctaway, NJ, USA, pp. 1-6, Dec. 7, 2009.

PCT International Search Report and Written Opinion dated Feb. 29, 2012 for PCT Application No. PCT/US2011/059639; Filing Date: Nov. 7, 2011 (11 Pages).

* cited by examiner

ELECTRONICALLY CONTROLLED SQUISHABLE COMPOSITE SWITCH

CROSS REFERENCE TO RELATED APPLICATIONS

This application is a continuation of U.S. patent application Ser. No. 13/291,016, filed on Nov. 7, 2011, which claims the benefit of U.S. Provisional Application No. 61/410,611, filed on Nov. 5, 2010, the contents of which are hereby incorporated by reference herein.

GOVERNMENT RIGHTS

This invention was made with government support under Grant #ECCS-0939514 awarded by the National Science Foundation. The Government has certain rights in this invention.

FIELD OF INVENTION

This application is related to electronic devices.

BACKGROUND

Micro-Electromechanical Systems (MEMS) devices are starting to be used in a variety of applications. In particular, there is great demand for MEMS switches due to their low power consumption, very small size, low cost, reliable, wide tuning range, low loss digital switching, low phase noise, low insertion loss, higher isolation, better linearity and single chip packaging which are almost impossible with standard semiconductor switches.

SUMMARY

A method and apparatus for making analog and digital electronics which includes a composite including a squishable material doped with conductive particles. A microelectromechanical systems (MEMS) device has a channel made from the composite, where the channel forms the primary conduction path for the device. Upon applied voltage, capacitive actuators squish or squeeze the composite, causing it to become conductive. The squishable device includes a control electrode, and a composite electrically and mechanically connected to two terminal electrodes. By applying a positive or negative voltage to the control electrode relative to a first terminal electrode, an electric field is developed between the control electrode and the first terminal electrode. This electric field results in an attractive force between the control electrode and the first terminal electrode, which compresses the composite and enables electric control of the electron conduction from the first terminal electrode through the channel to the second terminal electrode. The degree of conduction of the composite may be controlled by the control electrode voltage.

BRIEF DESCRIPTION OF THE DRAWINGS

A more detailed understanding may be had from the following description, given by way of example in conjunction with the accompanying drawings, wherein.

DETAILED DESCRIPTION OF THE EMBODIMENTS

It is to be understood that the figures and descriptions of embodiments of the electronically controlled squishable composite switch ("squitch") have been simplified to illustrate elements that are relevant for a clear understanding, while eliminating, for the purpose of clarity, many other elements. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

Analog and digital electronic devices may include a squishable material doped with conducting particles (herein referred to as "squitch material" or composite). Such squitch materials may exhibit a dramatically decreasing resistivity as the squitch material is compressed. The squishable material may include, but is not limited to, silicones, polymers, organic polymers, aerogels and the like. The squishable material may be doped with conductive particles including, but not limited to, nickel nano-particles, gold nano-particles, carbon black or carbon nanotube fragments and the like. In one embodiment, a combination of the different conductive particles may be used. Such squitch materials conduct via tunneling from particle to particle, (where the particles may never touch), and the tunneling currents grow exponentially as the particles become closer together. In some embodiments, conduction may occur via percolation, (where conduction follows a meandering connected path). Squitch material conductivity may vary by 12 orders of magnitude or more over a 40% strain.

As described herein, the squitch material may be used as the active element in electronically-controlled switches and may have application in both analog and digital electronics. In particular, the squitch material may be used to make an electrostatically actuated or electronically-controlled squishable switch, or "squitch" that may function as a gated transistor. Although the squitch may be referred to as a switch herein, (as applicable for digital circuits), it may be referred to as a transistor for purposes of both digital and analog circuits. The term squitch may be used herein to generically refer to an electronic device using such squitch material or composite materials. The squitch may exhibit a very large on-to-off conduction ratio, (up to $10^7$ to 1), and may exhibit a voltage-controlled conduction with a gain greater than 1 decade per 60 mV, a fundamental limit for silicon-based semiconductor switches. Moreover, these electronic devices may not use silicon, which can be an expensive substrate. They may be fabricated through printing or photolithography techniques and may be fabricated on, for example, flexible substrates.

Figure 1A:
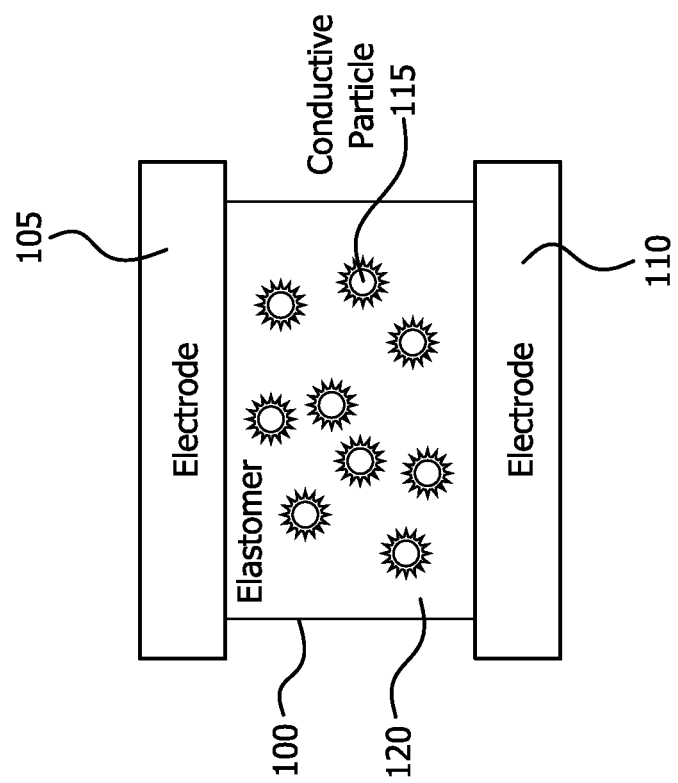
FIGS. 1A and 1B illustrate examples of a composite in two states.
Figure 1B:
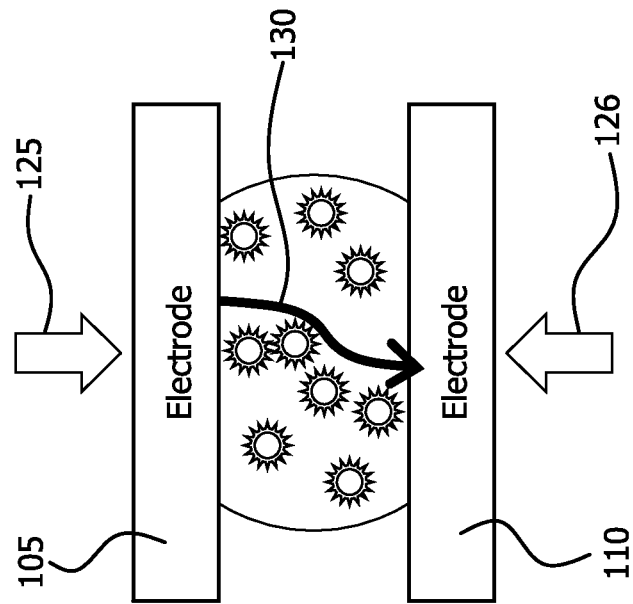

FIGS. 1A and 1B illustrate a composite 100 connected to a pair of electrodes 105 and 110. The composite 100, in a non-limiting example, may be a mixture of conductive particles 115 in a squishable material such as an elastomer matrix 120, where the elastomer matrix 120 may be doped near the percolation threshold. In a first state shown in FIG. 1A, the pair of electrodes 105 and 110 are in a non-compressive mode with respect to the composite 100. The composite 100, in this state, is highly resistive and a poor conductor that has little current flow. In a second state shown in FIG. 1B, the pair of electrodes 105 and 110 are in a compressive mode, (as shown by arrows 125 and 126), with respect to the composite 100. As shown by the arrow 130, the compressed composite 100 conducts via tunneling from one conductive particle 115 to another conductive particle 115 and provides decreased resistivity. In another embodiment, a compressed composite may conduct via percolation. In another embodiment, a compressed composite may conduct via percolation as well as tunneling. The type of conduction may depend on the type of dopant selected. As described herein below, the squishable material composition, curing period and other factors may be selected to determine the resistance and mechanical characteristic of the composite 100. For example, by making the material softer, it may take less force, and hence less actuation voltage, to make the squitch move.

Figure 2:
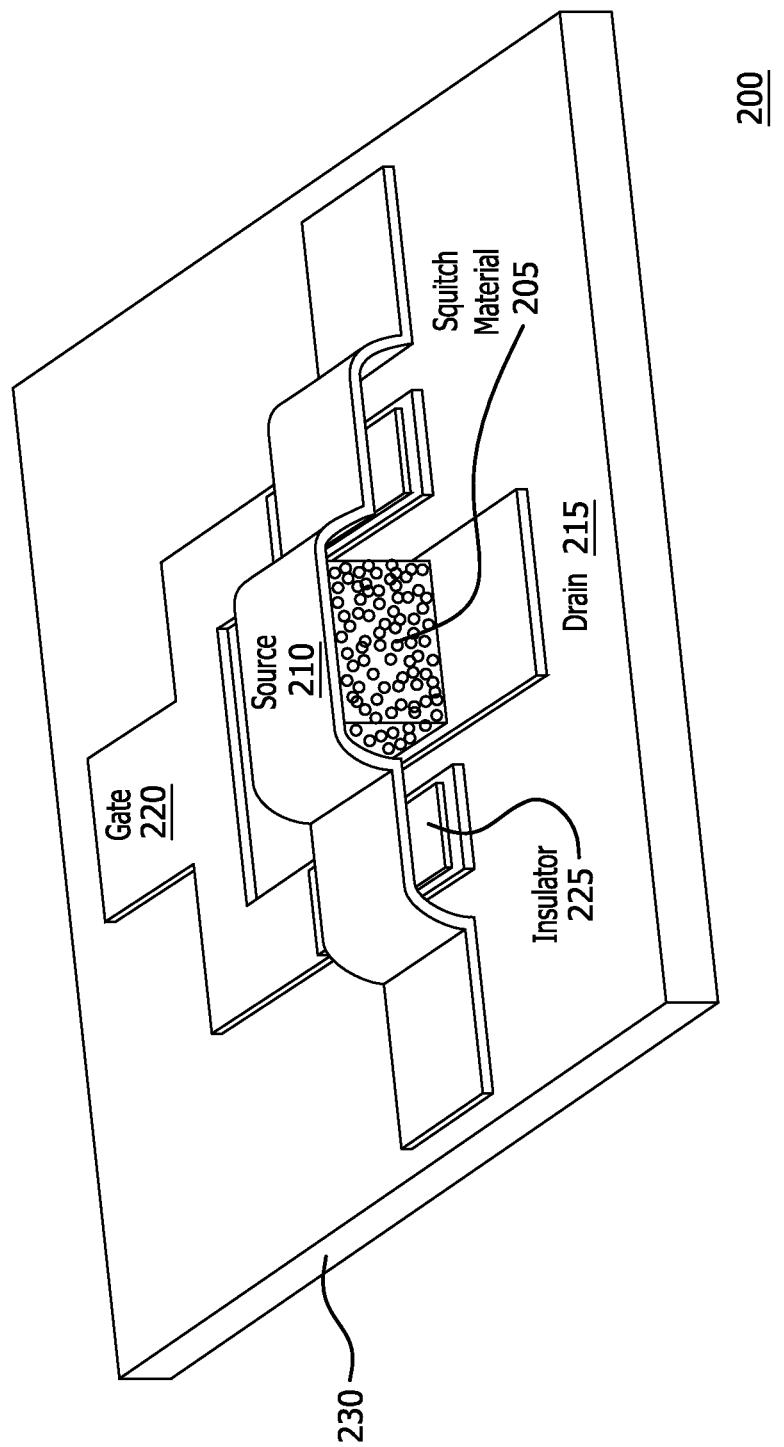
FIG. 2 illustrates an embodiment of a three-terminal squishable or squeezing switch ("squitch")

FIG. 2 shows an embodiment of an electronically-controlled or electrostatically actuated squishable-composite switch or squitch 200. As illustrated, the squitch 200 is a three-terminal device. For purposes of illustration, the terminals may be labeled as per the comparable terminals in a metal-oxide-semiconductor field-effect transistor (MOSFET). For example, a gate electrode may refer to or be a control electrode, and a source and drain may refer to or be terminal electrodes on each side of the squitch material or composite. The squitch may also be implemented as a four-terminal device as discussed herein below.

The squitch 200 may include a squitch material such as a doped polymer composite 205 that is connected electrically and mechanically to a source 210 and a drain 215. The source 210 and drain 215 may be, for example, metal conductors that form the two electrodes of the primary conduction path through the squitch 200. The squitch may further include a gate 220, which may also be, for example, a metal conductor. An insulator 225 may be positioned between the source 210 and gate 220 to prevent a short circuit between the source 210 and gate 220 upon application of a voltage as described herein. Although FIG. 2 shows that the insulator 225 may be situated on the gate 220, in another embodiment, the insulator 225 may be situated on the source 210. Although metal conductors are described herein for the gate 220, source 210 and drain 215, other applicable conductors may be used. The gate 220, source 210 and drain 215 are fabricated on a substrate 230. In a non-limiting example, the substrate 230 may be silicon, glass, plastic, flexible materials or the like. Although not shown, an insulating film may cover the substrate 230.

The doped polymer composite 205, as fabricated and in a relaxed state, would be a poor conductor and permit little if any electron current to flow from the source 210 to the drain 215. In one embodiment, the doped polymer composite may have at least 0.5 wt %, (by weight percentage), particles. In another embodiment, the doped polymer composite may have up to 50 wt % particles. In general, the amount of dopant needed may be dependent on the type/size/shape of the conductive particles. The resistance of this conduction path would be very large, putting the squitch 200 in an "off state". The doped polymer composite 205 may start to conduct as it is compressed, in the vertical direction, for example. When compressed sufficiently, the doped polymer composite 205 would conduct very well, putting the squitch in an "on" state, (the "squished state"). The direction of compression may be defined by the placement or positioning of the respective electrodes, and the vertical direction described herein is a non-limiting example.

The degree of conduction of the doped polymer composite 205 may be controlled by the gate 220. By applying a voltage to the gate 220 relative to the source 210, either positive or negative, an electric field may be developed between the gate 220 and the source 210. This electric field may result in an attractive force between the gate 220 and source 210, which may compress the doped polymer composite 205 and enable electric control of the electron conduction from the source 210 to the drain 215. The squitch 205, therefore, may be a voltage-controlled conductor in the same manner as a field effect transistor (FET) or a bi-polar junction transistor (BJT) is a voltage-controlled conductor.

Figure 3:
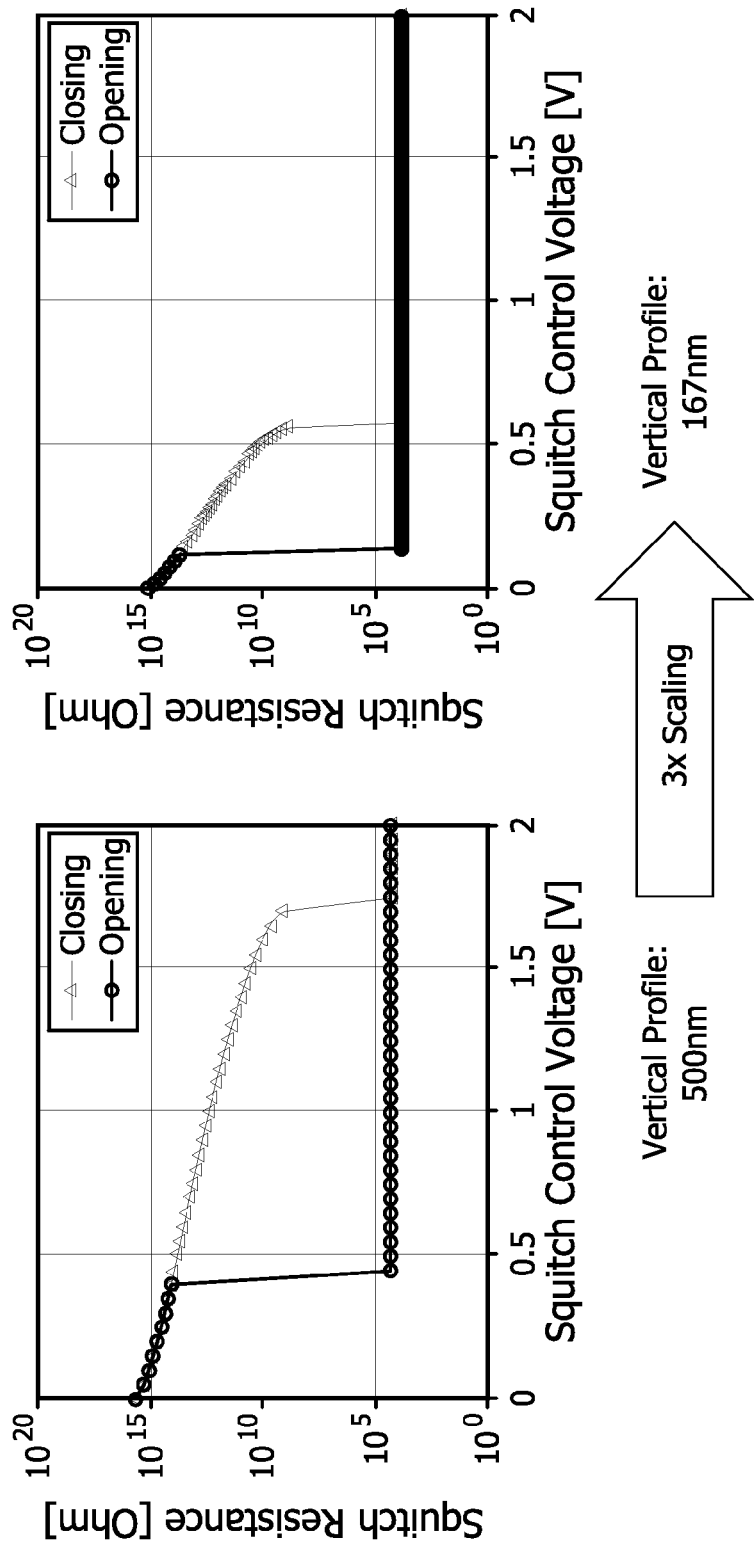
FIG. 3 illustrates example squitch drain-to-source resistances as a function of gate-to-source voltage for different gate capacitor air gaps.
Figure 4:
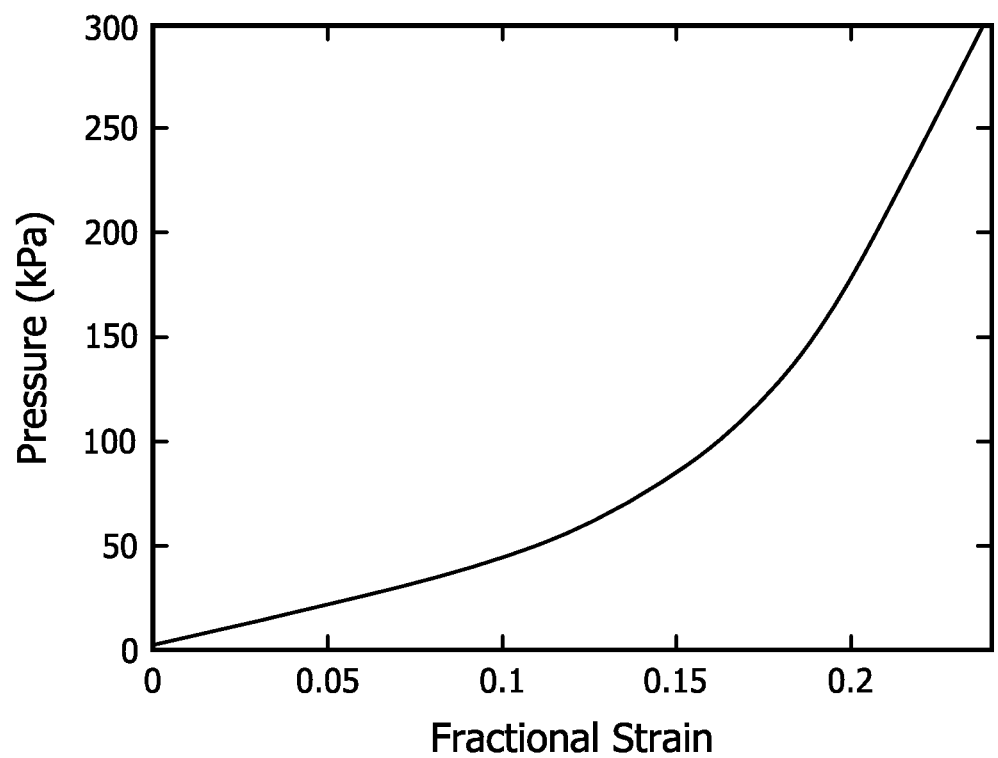
FIG. 4 illustrates an example stress-strain characteristic of an example nickel-doped-polymer composite.
Figure 5:
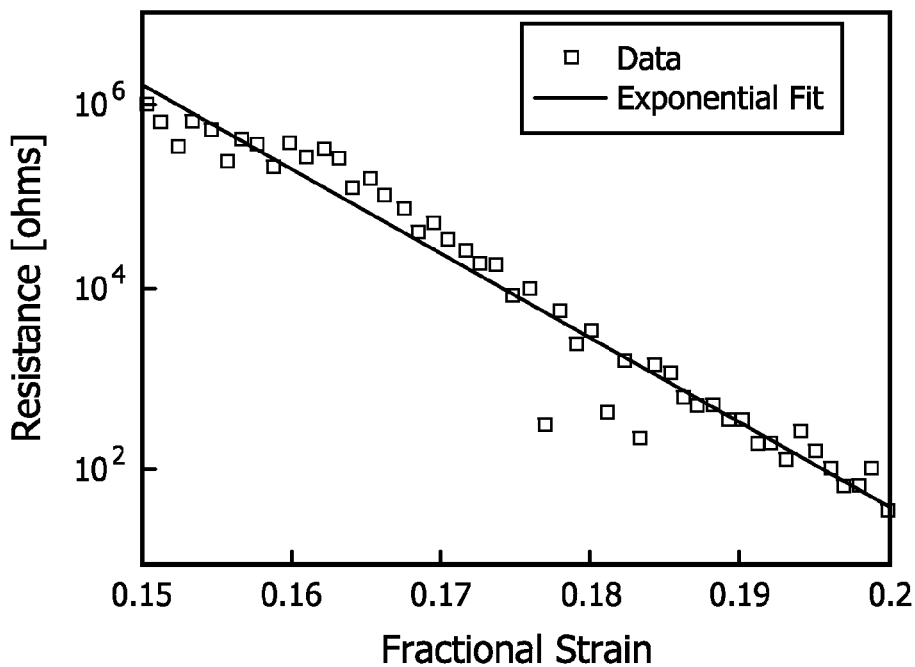
FIG. 5 illustrates an example resistance strain of the experimental nickel-doped-polymer composite.

The stair-case shape of the source 210 may serve two purposes. First, the stair-case shape indicates that it may be desirable to reduce the spring constant of the source 210 since this spring must also be compressed in order to compress the doped polymer composite 205. For example, a straight metal (or other material) structure may have a larger stiffness than a bent one. Second, by moving the middle step in the source 210 closer to the gate 220, the field strength may be enhanced for a given gate-to-source voltage. This may permit compression of the doped polymer composite 205 with lower gate-source voltages. However, it may limit the extent of compression of the doped polymer composite 205 since the source 210 must stop upon reaching the gate 220. A tradeoff in the design of the gate electrode therefore exists. For example, as shown in FIG. 5, by the time a composite is squished by 30% of its original length in the squishing direction, it may have exhibited the majority of its conduction change and the composite may also get much harder to squish at this point, as shown in FIG. 4. The middle step may therefore be moved as close to the gate as possible while still permitting a 20-30% strain (squishing) of the composite. FIG. 3 shows example squeezing switch drain-to-source resistances as a function of gate-to-source voltage for different gate capacitor air gaps. In this plot, the term "3× vertical scaling" means that all vertical dimensions, (with reference to FIG. 2), including for example the squisbable material thickness, gate-source electrode gap, insulator bumper-stop gap and the like, were reduced by a factor of 3 but the lateral dimensions (area) were not changed.

Figure 2A:
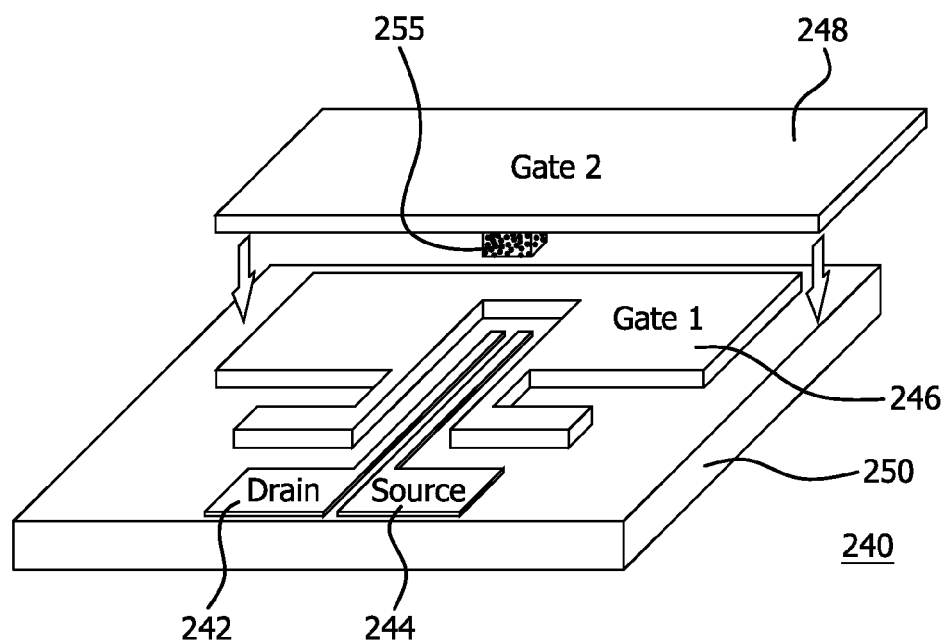
FIG. 2A illustrates an embodiment of a two gate squitch.

FIG. 2A illustrates an embodiment where the drain 215 of FIG. 2 may be split in half to become the drain and the source. In particular, the squitch 240 may include a drain 242, a source 244, a first gate 246 and a second gate 248. All of which, may be made on a substrate 250. The squitch 240 may include a squitch material such as a doped polymer composite 255 that may be electrically isolated from, but still mechanically connected to the second gate 248. An insulating layer (not visible) may be placed between the doped polymer composite 255 and second gate 248. This isolates the second gate 248 from the doped polymer composite 255 to make a true four terminal device. The second gate 248 may have stepped shape, (the staircase configuration described herein above), so that the regions attracted to the first gate 246 are closer to first gate 246.

In this embodiment, electron conduction occurs laterally through the doped polymer composite 255. The compression of the doped polymer composite 255 may be controlled by the voltage between the two gates, while the conduction occurs between the independent source 244 and drain 242. Thus, the conduction path is separated from the control electrodes, i.e., the first gate 246 and a second gate 248. In particular, the conduction is from the source 244 into the doped polymer composite 255 and back out the drain 242. In this embodiment, the attraction between the two gates actuates the device. Although not shown in FIG. 2A, the second 248 gate may have a spring structure similar to source 210 in FIG. 2. The second gate 248 may be stepped to reduce the actuation voltage. The electrical connection to the second gate 248 may be made via the stepped spring.

As stated earlier, the squitch may be a four terminal device. This may be clearly shown by squitch 240 which includes two conduction terminals, (i.e., drain 242 and source 244), and two control electrodes, (i.e., first gate 246 and second gate 248). A relay may be built using this configuration as opposed to a transistor. The relay may have a smooth variable conduction through a squitch material so that the transistor behavior is exhibited.

Figure 2B:
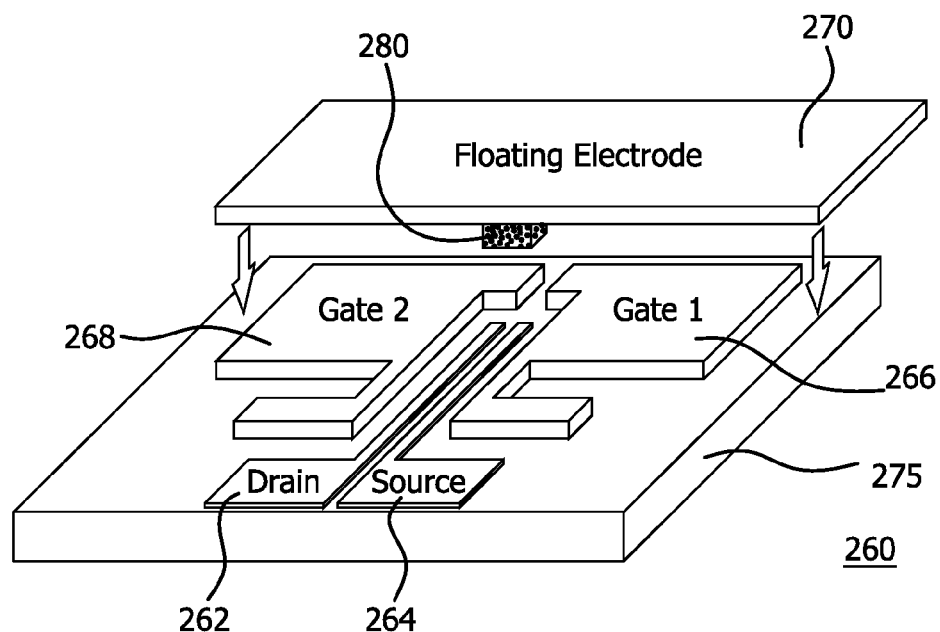
FIG. 2B illustrates an embodiment of another two gate squitch.

FIG. 2B illustrates an embodiment of a squitch 260. The squitch 260 may include a drain 262, a source 244, a first gate 266, a second gate 268, and a floating electrode 270. All of which may be made on a substrate 275. The squitch 260 may include a squitch material such as a doped polymer composite 280 that may be electrically isolated from but mechanically connected to the floating electrode 270. An insulating layer (not visible) may be placed between the doped polymer composite 280 and the floating electrode 270. This isolates the second floating electrode 270 from the doped polymer composite 280.

In this embodiment, the first gate 246 of FIG. 2A may be split at the back end of the horseshoe into two electrically separated halves, (i.e., the first gate 266 and the second gate 268). The second gate 248 of FIG. 2A may now become a floating electrode and no connection may need to be made to this electrode. A voltage may be applied between the first gate 266 and the second gate 268 and the floating electrode 270 may still be attracted to the first gate 266 and the second gate 268 as before. This embodiment may alleviate the need to have a connection to the floating electrode 270. For example, the floating electrode 270 may be simply positioned on the doped polymer composite 280. In another embodiment, a spring may be used to enhance tipping stability. In another embodiment, as described herein above, the floating electrode 270 may have a stepped shape so that those regions of the floating electrode 270 that are attracted to first gate 266 and second gate 268 are closer to the first gate 266 and second gate 268.

Figure 10:
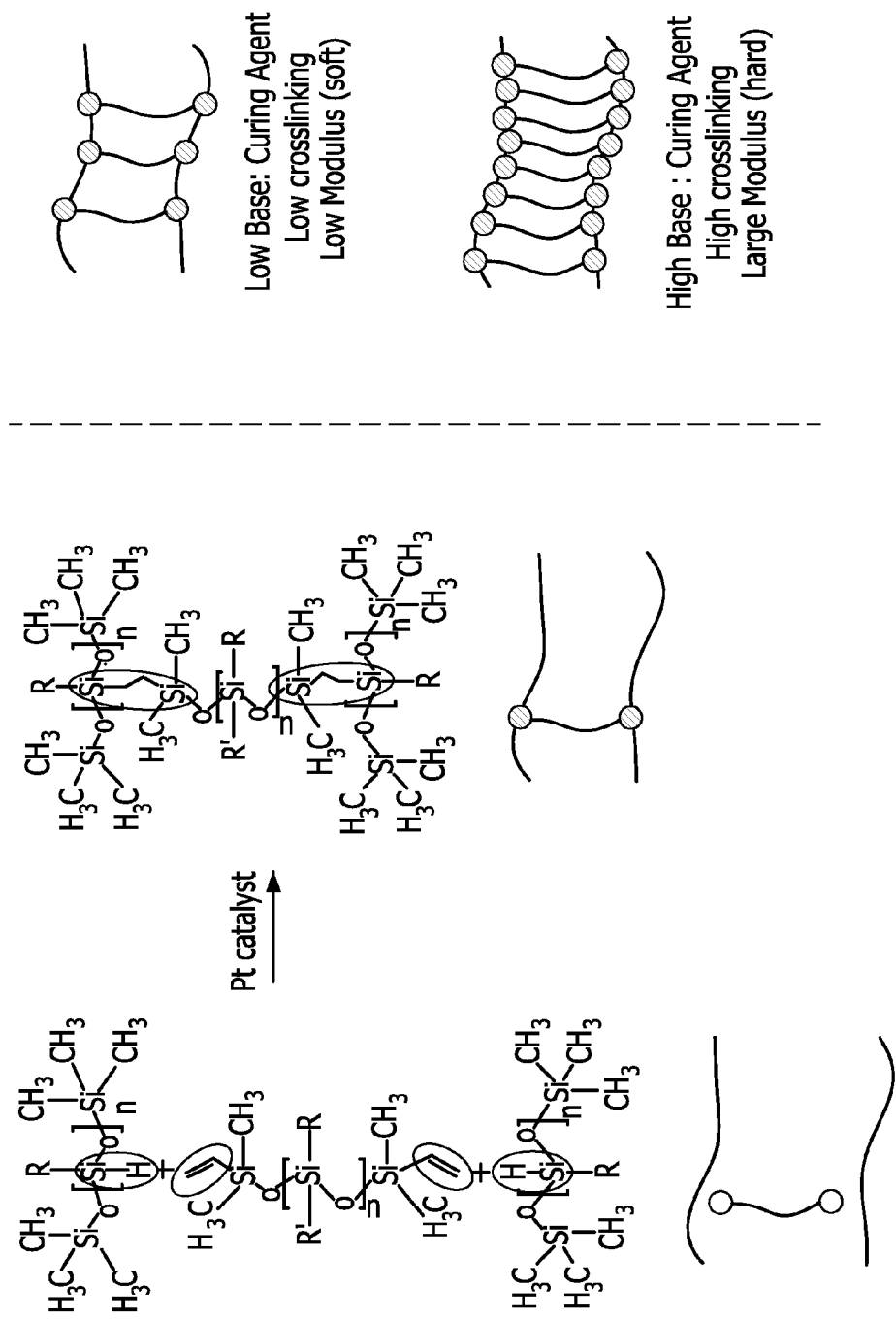
FIG. 10 illustrates low crosslinking and high crosslinking.

In implementing and fabricating the squitch embodiments described herein, different squishable materials may be used. In one embodiment, an extremely soft elastomer such as silicone, (i.e., Ecoflex® 00-10), has been used for the polymer matrix. Other like materials may be used. The term extremely soft or mechanically soft may refer to a squishable material having a Young's modulus in the range of 1-2 MPa. In another embodiment, the squishable material may have a Young's modulus of at least 100 KPa. The term extremely soft or mechanically soft may also refer to a squishable material having a low crosslinking density, (as illustrated in FIG. 10 for Ni-polydimethysiloxane (PDMS)), where low cross-link densities decrease the viscosities of polymer melts and high cross-link densities may cause materials to become very rigid or glassy. Using a soft polymer permits achieving the desired strain with the least possible stress, and hence the least possible control voltage. This increases the voltage-control gain of the squitch. In this embodiment, the PDMS has been uniformly mixed with nickel particles approximately 2.5 µm in diameter. For example, the term uniformly mixed may refer to equally distributed particles, equally spaced particles or both. In general, uniformly mixed may mean that the particles are not clumped, but are individually dispersed in a generally uniform, (as measured by their relative spacing), manner. In a non-limiting example, mixing may be done using a planetary mixer. Although nickel is used in this embodiment, other conductive nano-scale and micro-scale particles may be used such as carbon nanotube fragments, graphene, graphite, metal particles, conductive metal oxide particles, and others. FIG. 4 shows the stress-strain characteristic of an example nickel-doped-polymer composite. FIG. 5 shows the measured resistance of a nickel-doped-polymer composite sample as a function of strain.

Figure 6:
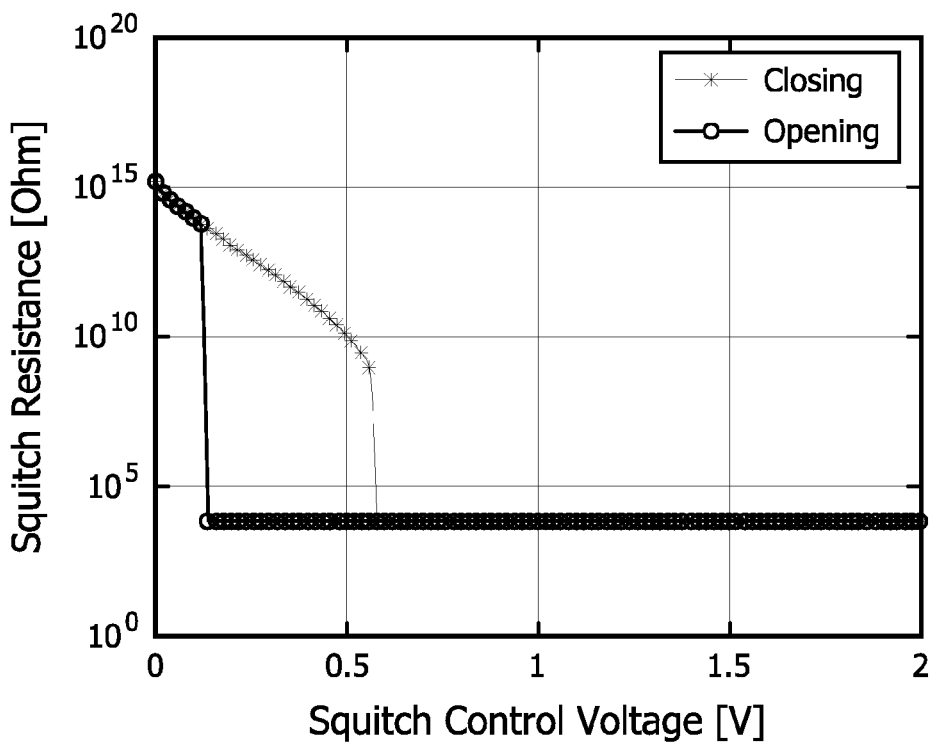
FIG. 6 illustrates an example squitch drain-to-source resistance as a function of gate-to-source voltage.

On the basis of the data in FIGS. 4 and 5, a simulated controlled conduction is shown in FIG. 6 of an example squitch. The plot is a function of the applied gate-to-source control voltage and in particular shows the squitch drain-to-source resistance as a function of gate-to-source voltage. In this example squitch, the polymer is assumed to be a factor of 10 more compliant than shown in FIG. 4. Note that the resistance of the squitch shown in FIG. 5 varies on average by one decade per 48 mV, which exceeds the one decade per 60 mV typically exhibited by a silicon BJT transistor.

Figure 7:
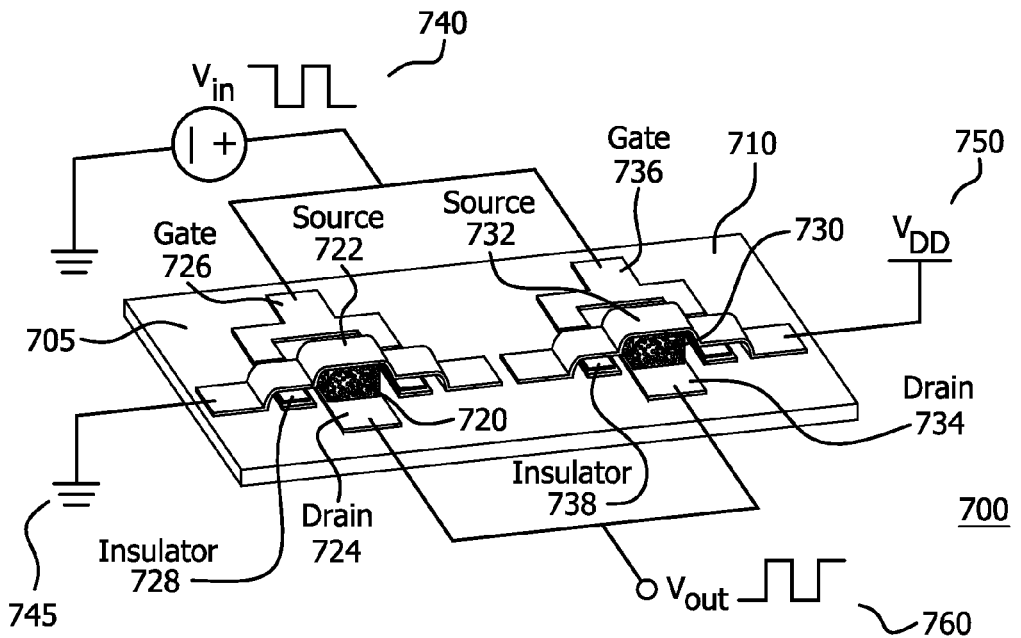
FIG. 7 illustrates an embodiment of a digital inverter using a squitch.

FIG. 7 is an embodiment of digital logic implemented using squitches. In particular, an inverter 700 is implemented using complementary metal-oxide-semiconductor (CMOS) logic design principles and more complex logic may follow directly here from. The inverter 700 has first squitch 705 and a second squitch 710. The first squitch 705 may include a doped polymer composite 720, a source 722, a drain 724, a gate 726 and an insulator 728 configured as shown in FIG. 2. The second squitch 710 may include a doped polymer composite 730, a source 732, a drain 734, a gate 736 and an insulator 738 also configured as shown in FIG. 2. An input voltage $V_{in}$ 740 may be tied to gate 726 and gate 736. The source 722 of first squitch 705 may be tied to ground 745 and the source 732 of second squitch may be tied to $V_{DD}$ 750. The drain 724 of first squitch 705 and the drain 734 of second squitch 710 may be tied to an output voltage $V_{out}$ 760.

As described hereinabove, a squitch may be turned on by applying either a positive or negative gate-to-source voltage and developing an attractive force between the gate and source electrodes. This makes it possible to implement CMOS-like logic using two identical squitches, as opposed to using complementary switches like the p-type and n-type FETs used in CMOS technology. For example, using the simulated resistance-voltage characteristics of the example squitch shown in FIG. 6, lower and upper gate-to-source threshold voltages may be defined, near 0.1 V and 0.6 V, respectively. In this situation, the squitch will turn on upon application of a high input voltage magnitude above the upper threshold, and the squitch will turn off upon application of a low input voltage magnitude below the lower threshold.

This switching characteristic, combined with the fact that the source 722 of first squitch 705 is tied to ground and the source 732 of the second squitch 710 is powered by $V_{DD}$, allows the inverter 700 to function as a logic inverter. It is the absolute value of the gate-to-source voltage of the squitch that determines its conduction. Consequently, the first squitch 705 turns on with a high input voltage and the second squitch 710 turns off with a high input voltage. The reverse is true for a low input voltage. Thus, like CMOS logic, the static power consumption of squitch-based logic may be very small since one of the two squitches is always in an off state.

Figure 8:
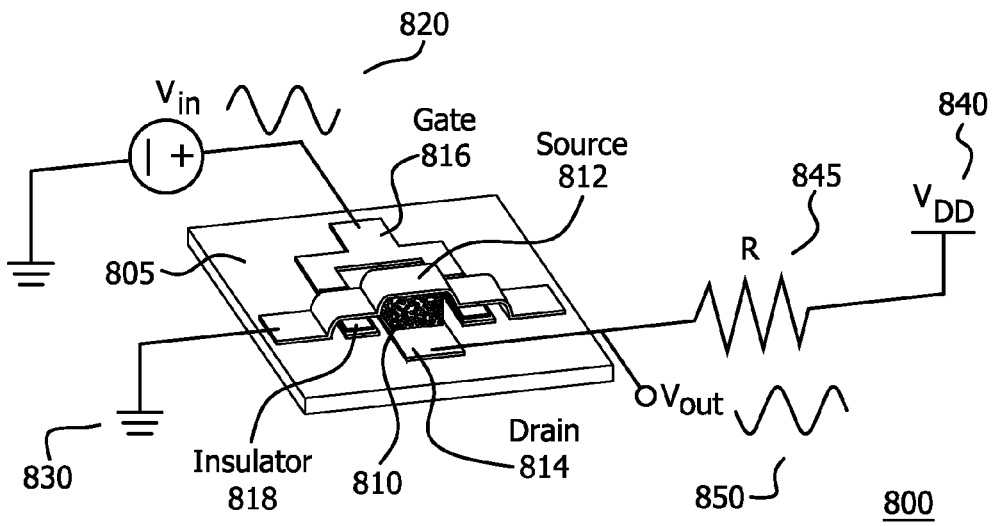
FIG. 8 illustrates an embodiment of a common source analog amplifier.

FIG. 8 is an embodiment of analog circuit using a squitch. In particular, an analog amplifier 800 may be implemented using a squitch 805. A squitch 805, as described herein, may include a doped polymer composite 810, a source 812, a drain 814, a gate 816 and an insulator 818 configured as shown in FIG. 2. The gate 816 may be tied to an input voltage $V_{in}$ 820 and the source 812 may be tied to ground 830. The drain 814 may tied to $V_{DD}$ 840 through a pull-up resistor 845 and to an output voltage $V_{out}$ 850.

In this embodiment, the analog amplifier 800 may be a single-stage amplifier that mimics a common-source FET amplifier and a common-emitter BJT amplifier. However, more complex analog circuits, for example but not limited to, operational amplifiers, filters, multipliers, oscillators, power supplies and other analog devices may be built as multi-stage squitch circuits following the general principles of analog design. In analog electronics, a common-source amplifier is one of three basic single-stage amplifier topologies, typically used as a voltage or transconductance amplifier. In this circuit, the gate-to-source voltage of the transistor serves as the input, and the drain-to-source voltage serves as the output. The drain is connected to a power supply through a pull-up resistor, and the source is grounded.

In view of this and using, for example, the simulated resistance-voltage characteristics of the example squitch shown in FIG. 6, a lower and upper threshold voltage may be defined, near 0.1 V and 0.6 V, respectively. Below the upper threshold, as a transconductance amplifier, the input voltage $V_{in}$ 820 may smoothly modulate the resistivity of the doped polymer composite 810 by creating an electric field between the gate 816 and the source 812 that compresses the doped polymer composite 810. The output voltage across the drain 814-to-source 812 of the squitch 805 may then vary in accordance with the power-supply voltage divider formed by the series connection of the doped polymer composite 810 and the pull-up resistor 845.

Figure 9:
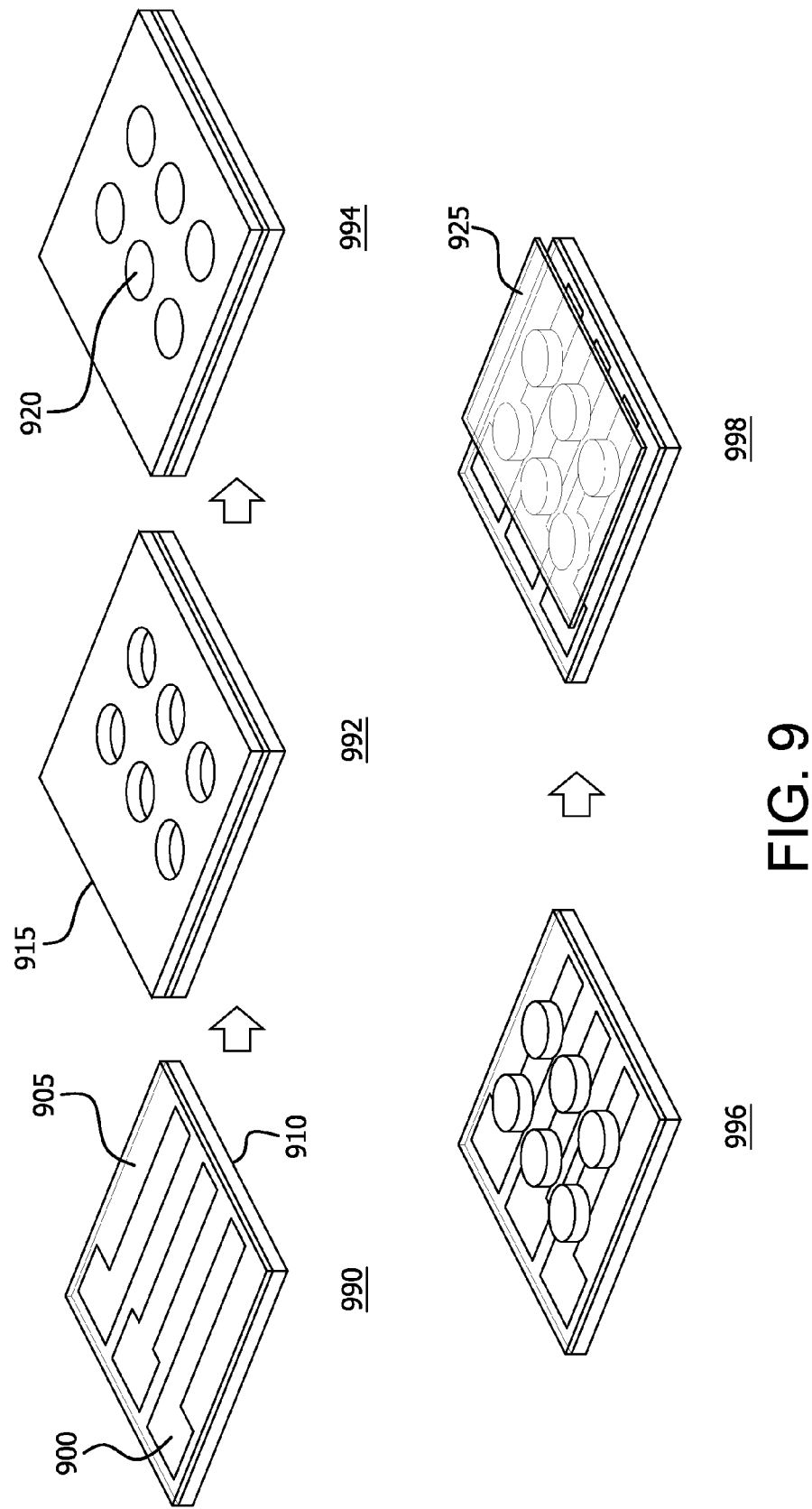
FIG. 9 illustrates an example fabrication process for the squitch.

As described herein, the squitches may be fabricated using photolithographic and printing techniques. FIG. 9 shows an example method of fabricating a squitch. Drain electrodes 900 may be deposited and patterned on a silicon oxide layer 905 on a substrate 910 (990). In non-limiting examples, the drain electrodes 900 may be 50 nm gold (Au) electrodes, the silicon oxide layer 905 may be a 300 nm $SiO_2$ layer and the substrate 910 may be a p-type silicon substrate. A mask 915 may be placed on top of the drain electrodes 900 to establish a pattern for a doped polymer 920 (992). In a non-limiting example, the mask 915 may be a 120 μm stainless steel mask.

The doped polymer 920 may be deposited or spun onto the patterning mask 915 and the unnecessary portions of the doped polymer 920 may be removed from the mask surface (994). In one embodiment, the patterning may be done with reactive ion etching using a photo mask. In another embodiment, a photo-patterned resist may be used as a mask. This may produce a smaller patterned polymer-composite as the resist may allow for finer feature sizes. In an embodiment where carbon nanotube fragments may be used as the dopant, the carbon nanotube fragments may be etched away with the polymer using the same etchant (assuming the polymer and dopant are both carbon based), resulting in a clean device, (noting that reactive ion etching with metal nanoparticles may leave metal nanoparticle dust on the surface as the same etchant may not remove the metal nanoparticle dust). The doped polymer 920 may be a mechanically soft Ni-polydimethysiloxane (PDMS) uniformly mixed with nickel particles. For example, the ratio of Ni to PDMS may be 3:2 by weight. The PDMS, for example, may have low cross linking and a 2-10% curing agent. For example, a PDMS crosslinking reaction is shown in FIG. 10. The degree of crosslinking is directly proportional to both the percentage of curing agent added and the eventual Young's modulus. In a non-limiting example, the doped polymer may be in a liquid form at the patterning stage. In non-limiting examples, the diameter of the patterned doped polymer 920 may be 250 μm, 500 μm or 1 mm.

The patterning mask 915 may be removed and the doped polymer 920 may be cured (996). In the photo-patterned resist embodiment, the mask for the polymer patterning may be removed after curing. In a non-limiting example, the doped polymer 920 may be cured at 100° C. for 10 minutes. After the curing period, the source electrode 925 may be placed on top of the doped polymer 920 (998). In a non-limiting example, the source electrode may be aluminum.

Figure 11:
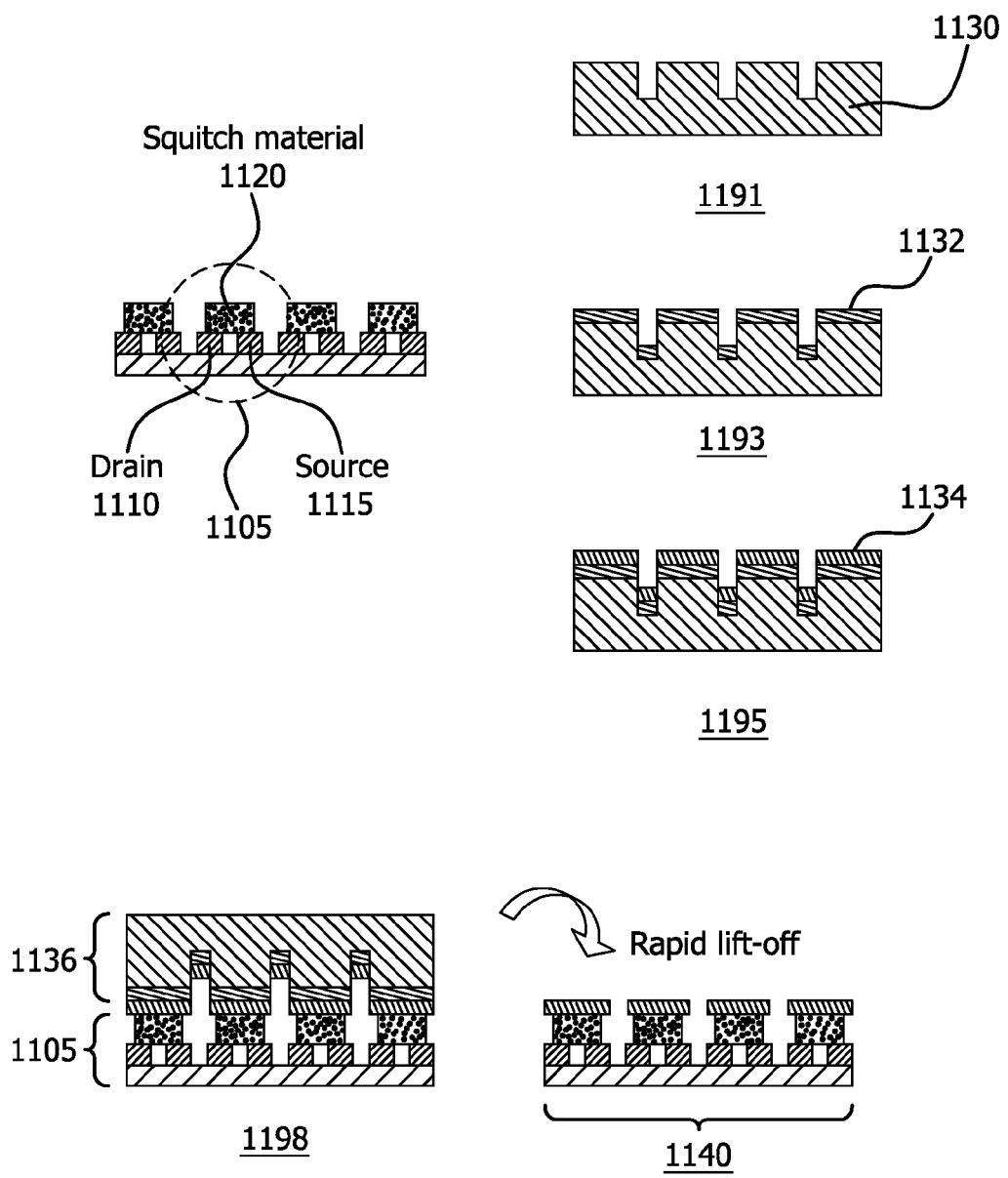
FIG. 11 illustrates an example fabrication process for a second gate electrode.

FIG. 11 shows a fabrication process for the second gate electrode 248 of FIG. 2A or the floating electrode 270 of FIG. 2B. In particular, FIG. 11 shows a transfer pad fabrication process that has a PDMS transfer pad with raised mesas 1130 made using a mold (1191). The PDMS transfer pad 1130 may then be treated with oxygen plasma for 30 seconds. An organic release layer 1132 is thermally evaporated onto the transfer pad 1130 (1193). A metal electrode 1134, for example gold, may be thermally evaporated on top of the organic release layer 1132 (1195). As described herein above, the gold electrode 1134 may have a spring shape or a stepped shape.

A squitch 1105 may include squitch material 1120 in contact with a drain 1110 and a source 1115. The squitch 1105 may then be brought into conformal contact with the gold electrode 1134 on the transfer pad 1136 (1198). The transfer pad 1136 is lifted away rapidly from the squitch 1105 to transfer gold electrode 1134 to form, for example, a squitch 1105 with a second gate electrode, collectively squitch 1140 (1199). See, "Micro-contact Printed MEMS", by Murarka, Packard, Yaul, Lang and Bulovic, *Micro Electro Mechanical Systems (MEMS)*, 2011 *IEEE 24th International Conference*, page 292-295, the entire contents of which are herein incorporated by reference.

Although features and elements are described above in particular combinations, each feature or element can be used alone without the other features and elements or in various combinations with or without other features and elements.

Those of ordinary skill in the art may recognize that many modifications and variations of the above may be implemented without departing from the spirit or scope of the following claims. Thus, it is intended that the following claims cover the modifications and variations provided they come within the scope of the appended claims and their equivalents.

What is claimed is:

1. An electronic device, comprising:
   a composite including a squishable material doped with a conductive particle throughout the squishable material;
   a source configured to be coupled to the composite;
   a drain configured to be coupled to the composite;
   a gate electrically isolated from the source;
   wherein application of a voltage above a predetermined threshold at the gate establishes an electric field between only the gate and source that compresses the composite and permits a predefined level of conductivity.

2. The electronic device of claim 1, wherein the conductive particle is at least one selected from the group of nickel, gold, carbon nanotube fragments, graphene, graphite, metal particles, conductive metal oxide particles, and carbon black.

3. The electronic device of claim 1, wherein the source has a stair case structure that supports proximity to the gate and minimizes a spring constant.

4. The electronic device of claim 1, wherein the composite is uncompressed in an off state and compressed in an on state.

5. The electronic device of claim 1, wherein the voltage is at least one of a positive or negative gate-to-source voltage that establishes an attractive force between the gate and the source.

6. The electronic device of claim 1, further comprising:
the gate being tied to an input voltage;
the source being tied to ground; and
the drain being tied to a pull-up resistor,
wherein an output voltage across a drain-to-source varies in accordance with a power-supply voltage divider formed by the composite and the pull-up resistor on a condition that the input voltage is below a predetermined threshold voltage.

7. The electronic device of claim 1, wherein the squishable material has a range of 2-10% curing agent by mass.

8. An electronic device, comprising:
a composite including a squishable material doped with a conductive particle throughout the squishable material;
a first terminal electrode configured to be coupled to the composite;
a second terminal electrode configured to be coupled to the composite; and
a control electrode electrically isolated from the first terminal,
wherein application of a voltage at the control electrode establishes an electric field between only the control electrode and a first terminal electrode that compresses the composite and permits a predefined level of conductivity from the first terminal electrode through the composite to the second terminal electrode.

9. The electronic device of claim 8, further comprising:
a second control electrode, wherein compression of the composite is controlled by a voltage between the control electrode and the second control electrode and a conduction path is separate from the control electrode and the second control electrode.

10. The electronic device of claim 8, further comprising:
a second composite;
a second first terminal electrode coupled to the second composite, wherein the first terminal electrode is tied to ground and the second first terminal electrode is tied to a supply voltage;
a second second terminal electrode coupled to the second composite, wherein the second terminal electrode and second second terminal electrode are tied to an output voltage; and
a second control electrode, wherein the control electrode and the second control electrode are tied to an input voltage,
wherein application of a voltage above a predetermined threshold at the control electrode and the second control electrode establishes an electric field between the control electrode and the first terminal electrode that compresses the composite and permits a predefined level of conductivity and application of a voltage below another predetermined threshold at the control electrode and the second control electrode establishes an electric field between the second control electrode and second first terminal electrode that compresses the second composite and permits a predefined level of conductivity.

11. The electronic device of claim 10, wherein the first terminal electrode and the second first terminal electrode have stair case structures that support proximity to the control electrode and the second control electrode and minimize a spring constant.

12. The electronic device of claim 8, wherein the conductive particle is at least one selected from the group of nickel, gold, carbon nanotube fragments, graphene, graphite, metal particles, conductive metal oxide particles, and carbon black.

13. The electronic device of claim 8, wherein the composite is uncompressed in an off state and compressed in an on state.

14. The electronic device of claim 8, wherein the squishable material has a range of 2-10% curing agent by mass.

* * * * *